United States Patent [19]

Fukuzawa et al.

[11] Patent Number: 4,827,483
[45] Date of Patent: May 2, 1989

[54] SEMICONDUCTOR LASER DEVICE AND METHOD OF FABRICATING THE SAME

[75] Inventors: Tadashi Fukuzawa, Tokyo; Naoki Chinone, Hachioji; Shin'ichi Nakatsuka, Kokubunji; Katsutoshi Saito, Higashiyamato; Takashi Kajimura; Yuuichi Ono, both of Tokyo, all of Japan

[73] Assignee: Hitachi, Ltd., Tokyo, Japan

[21] Appl. No.: 895,386

[22] Filed: Aug. 11, 1986

[30] Foreign Application Priority Data

| Aug. 12, 1985 | [JP] | Japan | 60-175823 |
| Sep. 11, 1985 | [JP] | Japan | 60-199417 |
| Oct. 14, 1985 | [JP] | Japan | 60-226720 |
| Nov. 6, 1985 | [JP] | Japan | 60-247018 |

[51] Int. Cl.$^4$ .................................................. H01S 3/19
[52] U.S. Cl. .......................................... 372/45; 372/46; 357/17
[58] Field of Search .................... 372/44, 45, 46, 48; 357/17, 4 SL

[56] References Cited

U.S. PATENT DOCUMENTS

| 4,594,718 | 6/1986 | Scifres et al. | 372/45 |
| 4,608,695 | 8/1986 | Oda et al. | 372/45 |

FOREIGN PATENT DOCUMENTS 0138386 10/1979 Japan ............................ 372/46

Primary Examiner—William L. Sikes
Assistant Examiner—B. Randolph Holloway
Attorney, Agent, or Firm—Antonelli, Terry & Wands

[57] ABSTRACT

A semiconductor laser device including at least one of a laser active layer formed of a super lattice and an optical guide layer formed of another super lattice is disclosed in which part of at least one of the super lattices is converted into a mixed crystal by the impurity induced disordering based upon one of impurity diffusion and impurity ion implantation, to divide the super lattice into a first region formed of the mixed crystal and a second region having the super lattice structure, the width of the second region in directions perpendicular to the lengthwise direction of a laser cavity varies along the above lengthwise direction, and the width of a laser excitation region is smaller than the mean value of the width of the second region, to generate laser oscillation having a single transverse mode and a multi longitudinal mode. Thus, the semiconductor laser device emits a laser beam which is small in astigmatism and low in optical feedback noise.

28 Claims, 10 Drawing Sheets

FIG. 20a-7
FIG. 20b-7
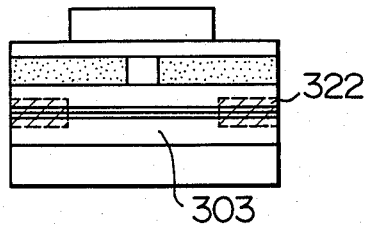
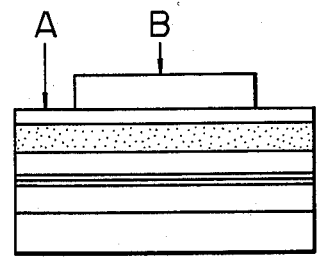
FIG. 20a-8
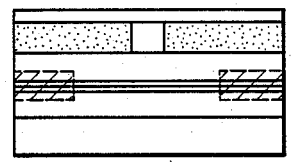
FIG. 20a-9
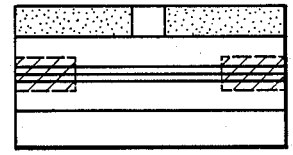
FIG. 20a-10
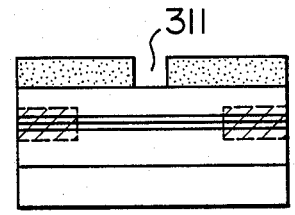

SEMICONDUCTOR LASER DEVICE AND METHOD OF FABRICATING THE SAME

BACKGROUND OF THE INVENTION

The present invention relates to a semiconductor laser device which can control the transverse mode of laser oscillation or has a transverse mode filter, and a method of fabricating the above device.

A method of fabricating a semiconductor laser device with a buried heterostructure, in such a manner that a laser active layer formed of a super lattice is partially converted into a mixed crystal by the impurity diffusion induced disordering, to obtain a large energy gap and a high refractive index in the mixed crystal region, is described in an article by T. Fukuzawa et al. (Appl. Phys. Lett., Vol. 45, 1984, page 1). In this method, crystal growth is carried out only once to form a semiconductor film indispensable for the laser device. That is, the method is suited for mass production of the laser device. However, the buried heterostructure formed by this method is of an index guiding type which generates a single transverse mode in the whole region of laser cavity, and thus a single longitudinal mode is generated Accordingly, the above method is not suited for forming a semiconductor laser device which is required to emit a laser beam of low optical feedback noise, such as a semiconductor laser diode for a compact disc.

Further, a semiconductor laser device which generates a multi longitudinal mode and in which proton implantation is used for current confinement, is described in an article by T. Mamine et al. (J. Appl. Phys., Vol. 54, 1983, page 4302). This laser, however, is of a gain guiding type, and hence a laser beam emitted from the laser device is large in astigmatism. Accordingly, in order to focus the laser beam on a very small spot, it is necessary to use an additional lens such as a cylindrical lens.

Further, a semiconductor laser device has been known in which an optical guide layer formed of a super lattice and disposed near a laser active layer is partially converted into a mixed crystal by impurity induced disordering, to form a stripe-shaped optical waveguide (refer to an article described by Kuroda et al. on pages L548 to L550 of the Japanese Journal of the Applied Physics., vol. 24, 1985). Now, the above semiconductor laser device will be explained below, by reference to FIG. 1. A p-GaAlAs layer 102 (serving as a cladding layer), a laser active layer 103, a super lattice layer 104 (serving as an optical guide layer), an n-type cladding layer 106 and an n-type cap layer 107 are successively grown to form a laser crystal on a P-GaAs substrate 101. A zinc-diffused region 111 is formed so that the optical guide layer 104 is partially converted into a mixed crystal region 105. The refractive index of the remaining super lattice region 104 is greater than that of the mixed crystal region 105, and hence the traverse mode of laser oscillation is confined in the super lattice region 104. In this laser device, however, the refractive index of the super lattice region 104 becomes smaller than that of the mixed crystal region 105, depending upon the amount of injected carrier, and hence it is impossible to obtain a stable transverse mode. Further, the super lattice layer is partially converted into the mixed crystal region by an electrically active impurity, and hence it is impossible to change the width of a stripe for index guiding, independently of the width of a stripe for current confinement.

Unlike an index guiding type semiconductor laser device a gain guiding type semiconductor laser device produces laser oscillation of multi longitudinal mode and emits a laser beam having a large amount of noise component. However, the noise generated when the laser beam is reflected back from a body, is low, that is, the laser beam is low in optical feedback noise, and hence the gain guiding type semiconductor laser device is suitable for use in a device which receives a large amount of reflected light, such as the pickup of a compact disc player. In the gain guiding type semiconductor laser device, however, the transverse mode of laser oscillation is unstable, and the far field pattern of the laser beam has a twin peak on the basis of a reduction in light intensity at a central portion of the laser beam due to the spatial hole burning. Thus, it is impossible to focus the laser beam on a single point.

Further, a semiconductor laser device has been known in which highly resistive regions formed by proton implantation are used for current confinement, and the gain varies along the lengthwise direction of laser cavity to solve the above problem of the gain guiding type semiconductor laser (refer to an article described by T. Mamine et al. on page 4302 of the J. Appl. Phys., Vol. 54, 1983). The formation of a highly resistive region by proton implantation has a drawback that the performance of the laser device is deteriorated because the highly resistive region is formed on the basis of defects produced by proton implantation. Further, the highly resistive region formed by proton implantation is extinguished by the annealing process at a temperature of 400° to 500° C. Accordingly, it is difficult to form a negative electrode which necessitates the alloying at temperatures higher than 400° C. In other words, it is necessary for a region used for current confinement to have no defect or few defects and to withstand a high temperature annealing process.

As has been already mentioned, a method of fabricating a semiconductor laser device with a buried heterostructure, in such a manner that a laser active layer formed of a multi quantum well (namely, a super lattice) is partially converted into a mixed crystal by impurity induced disordering, is described in the abovereferred article by Fukuzawa et al. (Appl. Phys. Lett., Vol. 45, 1984, page 1). In this method, however, the width of an electrode stripe is inevitably smaller than the region. For example, it is necessary to form a stripe having a width of 1 μm over a stripe having a width of 1.5 μm by the photo-lithographic method. Accordingly, it is not easy to fabricate the semiconductor laser device.

SUMMARY OF THE INVENTION

A first object of the present invention is to provide a semiconductor laser device in which the transverse mode of laser oscillation is stabilized by utilizing the impurity induced disordering of super lattice, and particularly to provide a semiconductor laser device which generates laser oscillation having a single transverse mode and a multi longitudinal mode, and emits a laser beam having a favorable beam profile and low optical feedback noise.

A second object of the present invention is to provide a method of forming a current confinement structure with few defects for making non-uniform gain distribution along the lengthwise direction of laser cavity, to obtain a semiconductor laser device which is fabricated by a simple process including a small number of steps, emits a laser beam of low optical feedback noise, generates a far field pattern having a single peak, and is long-lived.

A third object of the present invention is to provide a method of fabricating a semiconductor laser device in which the transverse mode of laser oscillation is confined in a predetermined region, by a self alignment process.

In order to attain the first object, a semiconductor laser device according to the present invention has the following structure. That is, as shown in FIG. 2, laser active regions 2 and 4 existing in the neighborhood of laser ends which emit a laser beam 1, is of an index guiding type, and a laser active region 3 sandwiched between the regions 2 and 4 is of a gain guiding type. In more detail, in a semiconductor laser device according to the present invention, the control of transverse mode by the impurity induced disordering of super lattice is applied only to both end regions, and the remaining region (that is, a central region) is a gain guiding type region due to current confinement. In order to obtain such a structure, high-energy impurity ions are implanted into a laser crystal so as to penetrate a super lattice layer which serves as, for example, a laser active layer. FIG. 3 shows relations between implant depth and impurity concentration in a case where silicon ions are implanted into a GaAlAs layer at implant voltages of 1 MV and 3 MV. In FIG. 3, curves 5 and 6 correspond to 1-MeV ions and 3-MeV ions, respectively. In ordinary semiconductor laser device, the distance between a laser active layer and a cap layer lies in a range from 1.5 to 2 $\mu$m. When accelerated by an implant voltage of 3 MV, silicon ions can reach the laser active layer. Further, since the ion accelerating voltage (namely, the implant voltage) is high, the silicon concentration will be reduced on the surface side of the crystal. Thus, an ion implanted region can be used as a current blocking region having a p-n-p or n-p-n structure.

When the crystal implanted with silicon is annealed at 800° C. for two hours, a super lattice formed of GaAs/GaAlAs layers will be extinguished, in a region where the silicon concentration is greater than or equal to $5 \times 10^{17}$ cm$^{-3}$, because of the mutual diffusion of atoms belonging to the III-group in the super lattice, that is, the impurity induced disordering of super lattice.

In order to fabricate a semiconductor laser device according to the present invention, a mask for implanting impurity ions into the super lattice layer has a variable width along the lengthwises direction of laser cavity. FIG. 4 shows a mask used in EMBODIMENT I which will be described later. In FIG. 4, a hatched area 7 indicates a region which is not implanted with impurity ions. The width $d_W^A$ of the hatched area (that is, a stripe) at both ends thereof is 1 to 3 $\mu$m, and the width $d_W^B$ of the stripe at a central portion thereof is far greater than the width $d_W^A$. FIG. 5 shows another mask used for implanting the impurity ions at an implant voltage lower than an implant voltage which is used for implanting the impurity ions through the mask of FIG. 4. In FIG. 5, a hatched area 8 indicates a region which is not implanted with the impurity ions, and the region 7 of FIG. 4 is indicated by broken lines, to show a positional relation between the regions 7 and 8.

Further, according to the present invention, the transverse mode of laser oscillation can be controlled by a function of super lattice different from the function used in the above case and the semiconductor laser device of FIG. 1. That is, in the device of FIG. 1, laser light is guided by utilizing the fact that the refractive index of the super lattice region 104 is greater than that of the mixed crystal region 105. Meanwhile, in the present case, the light absorption of a super lattice layer which is formed near a laser active layer, is used for controlling the transverse mode of laser oscillation.

In order to attain the second object of the present invention, a current confinement structure having few defects is formed by converting a super lattice of compound semiconductor into a mixed crystal on the basis of impurity induced disordering. A method of fabricating an index guiding type laser device in such a manner that a super lattice formed of GaAs/GaAlAs layers is partially converted into a mixed crystal by diffusing an impurity such as zinc into the super lattice, to make the band gap and refractive index of the mixed crystal region different from those of the remaining super lattice region, thereby obtaining an index guiding type laser device, is described in the above-referred article by Fukuzawa et al. (Appl. Phys. Lett., Vol. 45, 1984, page 1). In the present invention, a super lattice is partially converted into a mixed crystal by impurity induced disordering, to form a current confinement structure having a desired pattern. When the width $d_e^A$ of that mixed crystal region of a super lattice layer which exists in each end portion of a laser device is made equal to or greater than the width $d_e^D$ of an ion-implanted conductive region existing in each end portion and the width $d_c^A$ of the mixed crystal region existing in a central portion of the laser device is made greater than the width $d_c^D$ of the ion-implanted conductive region existing in the central portion, the transverse mode of laser oscillation can be controlled.

Further, in order to attain the third object of the present invention, ion implantation is carried out in the following manner. In view of the fact that a metal mask used for implanting high energy ions in a portion of a super lattice to convert the portion into a mixed crystal, has a thickness of at least 1 $\mu$m, the metal mas is mounted on the surface of a laser crystal to implant high energy ions therein, and the exposed area of the surface is filled with a photoresist material or polyimide resin capable of blocking low-energy active ions so that the surface of the metal mask and the filler becomes flat, after the high energy ions have been implanted into the super lattice. Thereafter, only the metal mask is etched off, and the low-energy ions are implanted in the laser crystal by using the above filler as a mask, to form an ion implanted region under a surface area corresponding to the metal mask. Thus, the high- and low-energy ions can be implanted by a self alignment process.

As has been already mentioned, a semiconductor laser device according to the present invention includes an index guiding type laser portion and a gain guiding type laser portion, and thus has both the advantage of an index guiding type laser and the advantage of a gain guiding type laser. Accordingly, the semiconductor laser device emits a laser beam which is small in astigmatism, has excellent beam characteristics, and is low in optical feedback noise.

Further, according to an aspect of the present invention, a high-performance laser device can be formed by carrying out crystal growth only once and by using ion implantation which is suited for mass production and is a reproducible process. That is, the laser device is fabricated at low cost.

Furthermore, according to another aspect of the present invention, there is provided a laser device including a narrow-stripe type multi-longitudinal-mode laser portion and an index guiding type fundamental-transverse-mode laser portion which are formed in such a manner that a super lattice is partially converted into a mixed crystal by electrically inactive impurity ions. Thus, a multi-longitudinal-mode laser beam of low optical feedback noise is emitted from the laser device in a state that the transverse mode of the emitted laser beam is limited to the fundamental mode. Accordingly, the laser beam can be focused on a small spot having a diameter less than 1 μm, and the laser device is suitable for use in a compact disc apparatus and a video disc apparatus.

According to a further aspect of the present invention, there is provided a method of forming a current confinement structure by carrying out crystal growth only once and performing a diffusion process or ion implantation process only once, to generate a laser beam which is low in optical feedback noise and forms a favorable far field pattern. An inexpensive, high-performance laser device can be mass produced by using the above method. The method is applicable to a laser crystal which includes a super lattice other than the super lattice made up of GaAs/GaAlAs layers.

Further, when a metal mask for the first ion implantation is used as a material for forming the open space of a mask for the second ion implantation in accordance with still another aspect of the present invention, a current confinement structure is accurately located in relation to an index guiding type structure by a self alignment process. Thus, the production yield of laser pellets cut out from a 2-inch wafer (having a diameter of about 5 cm) can be improved by more than one order of magnitude. For laser pellets cut out from the remaining portion of the wafer other than a peripheral portion having a width of 3 mm, variations in threshold current of laser oscillation lie in a range from +1.5% to −1.5%, and are far smaller than those in a prior art.

BRIEF DESCRIPTION OF THE DRAWINGS

FIGS. 13b and 13c are sectional views showing the embodiment which includes the mixed crystal region of FIG. 13a.

FIGS. 20a-1 to 20a-12 are sectional views for explaining the fabricating steps of still a further embodiment of a laser device according to the present invention, and show a laser portion of current confinement type.

FIGS. 20b-1 to 20b-7 are side views corresponding to FIGS. 20a-1 to 20a-7.

DESCRIPTION OF THE PREFERRED EMBODIMENTS

The present invention will be explained on the basis of the following embodiments.

EMBODIMENT I

Figure 5:
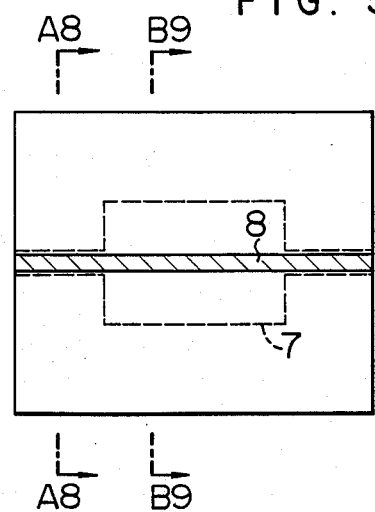
Figure 6:
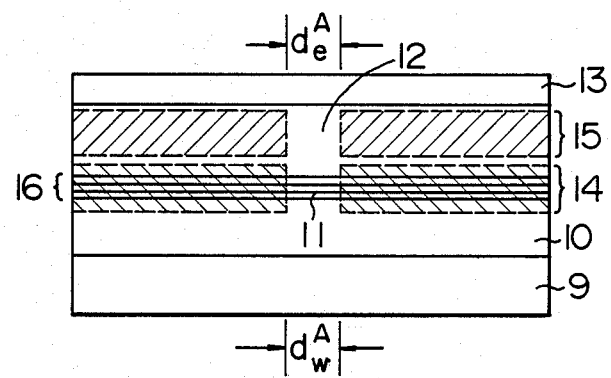
FIGS. 6 and 7 are sectional views showing an embodiment of a laser device according to the present invention.
Figure 7:
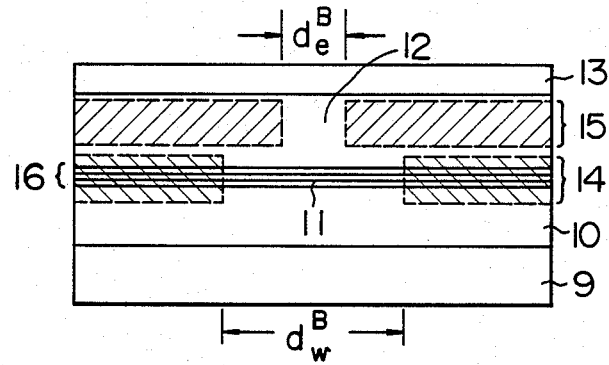

Referring to FIGS. 6 and 7, an n-$Ga_{0.65}Al_{0.35}As$ layer 10 (serving as a cladding layer), an undoped super lattice layer 11 (formed of GaAs/$Ga_{0.5}Al_{0.5}As$ layers and serving as a laser active layer), a p-$Ga_{0.65}Al_{0.35}As$ layer 12 (serving as another cladding layer), and a p-GaAs layer 13 (serving as a cap layer) are grown in this order by the molecular beam epitaxial method, to form a laser crystal on an n-GaAs substrate 9. Next, titanium is deposited on the cap layer 13 to a thickness of 300Å, and then tungsten is deposited on the titanium layer to a thickness of 1 μm. Thereafter, the tungsten layer is etched by photo-lithography and dry etching techniques so as to form a mask pattern 7 shown in FIG. 4. Then, silicon ions are accelerated by a voltage of 2.8 MV and implanted into the laser crystal at a dose rate of $1 \times 10^{14}$ cm$^{-2}$. Then, the tungsten mask having the pattern 7 of FIG. 4 is again etched by photo-lithography and dry etching techniques so as to form a mask pattern 8 shown in FIG. 5 (that is, a stripe having a width of 1 to 3 μm). Next, silicon ions are accelerated by a voltage of 1 MV and are implanted into the laser crystal. Thus, the cross sections of the laser crystal taken along the lines A6—A6 and B7—B7 of FIG. 4 have structures shown in FIGS. 6 and 7, respectively. In FIGS. 6 and 7 reference numeral 14 designates a region implanted with 2.8-MeV silicon ions and 15 a region implanted with 1-MeV silicon ions. The region 15 acts as a blocking layer for the positive hole, and thus a current flowing through the laser crystal is confined (or limited) to a width $d_e^A$ or $d_e^B$. In the mask pattern of FIG. 5, the width $d_e^A$ is equal to the width $d_e^B$. In the region 16, silicon ions are contained in the super lattice layer 11 at high concentration. Accordingly, when the laser crystal is annealed at 800° C. for two hours, the super lattice layer existing in the region 16 is converted into a mixed crystal which is smaller in refractive index than the remaining super lattice layer. Accordingly, a laser portion having the cross section of FIG. 6 (that is the portions 2 and 4 of FIG. 2) is of index guiding type. Meanwhile, a laser portion having the cross section of FIG. 7 (that is, the portion 3 of FIG. 2) is of gain guiding type, provided that a width $d_w^B$ is made not smaller than 10 μm. The above-mentioned facts were experimentally confirmed by fabricating a multiplicity of laser devices having straight line types wherein $d_w^A = d_w^B$ as shown in FIG. 6 and the value of $d_w^A$ ($=d_w^B$) is different from device to device and studying each operation type of these laser devices.

Figure 4:
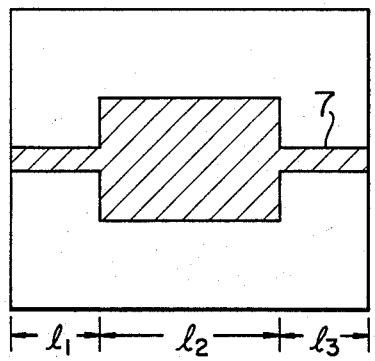
FIGS. 4 and 5 are schematic diagrams showing mask patterns for ion implantation.

A laser device having the cross sections of FIGS. 6 and 7 was fabricated by using the mask patterns of FIGS. 4 and 5, so as to satisfy the following conditions: $d_e^A = d_e^B = 2$ μm, $d_w^A = 3$ μm, $d_w^B = 20$ μm, $l_1 = l_3 = 50$ μm, and $l_2 = 150$ μm, and the characteristics of the laser device were studied. The threshold current of laser oscillation was 45 mA, and the relative intensity noise RIN was less than $5 \times 10^{-14}$ Hz$^{-1}$ as long as the reflected light quantity lay in a range of 0.01 to 10% of incident light quantity. That is, the laser beam emitted from the laser device was low in optical feedback noise. The laser beam formed a well-shaped, single-peak far field pattern, and the astigmatism of the laser beam was less than 2 μm. Thus, the laser device was peculiarly suited to the laser light source for compact disc. Further, the longitudinal mode of laser oscillation was a multi mode, and pulsation made it impossible to separate individual spectral lines completely. Thus, the laser device was able to have both the advantage of an index guiding type laser and the advantage of a gain guiding type laser.

EMBODIMENT II

Unlike the above-mentioned laser device in which a current confinement structure is formed by implanting 1-MeV silicon ions into the laser crystal, proton is implanted in a laser crystal by using the mask pattern of FIG. 5, to form a highly-resistive region for current confinement.

Figure 8:
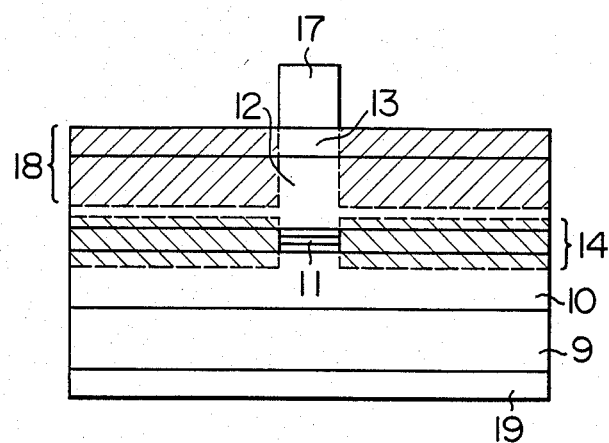
FIGS. 8 and 9 are sectional views showing another embodiment of a laser device according to the present invention.
Figure 9:
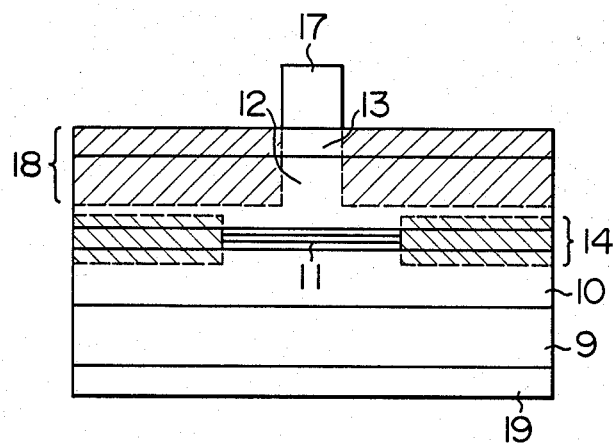

Referring to FIGS. 8 and 9, the n-Ga$_{0.65}$Al$_{0.35}$As layer 10 (serving as the cladding layer), the undoped super lattice layer 11 (formed of GaAs/Ga$_{0.5}$Al$_{0.5}$As layers and serving as the laser active layer), the p-Ga$_{0.65}$Al$_{0.35}$As layer 12 (serving as the cladding layer), and the p-GaAs layer 13 (serving as the cap layer) are grown by the organometallic chemical vapor deposition method (namely, the MOCVD method), to form the laser crystal on the n-GaAs substrate 9. Next, a molybdenum layer having a thickness of 0.15 μm and a gold layer having a thickness of 1.2 μm are deposited on the laser crystal so as to have the mask pattern shown in FIG. 4. Thus, a mask 17 is formed. Then, fluorine ions are accelerated by a voltage of 1 MV, and implanted into the laser crystal provided with the mask 17 at a dose rate of $2 \times 10^{14}$ cm$^{-2}$. Thus, the region 14 is formed. Then, the laser crystal is annealed at 850° C. for one hour, and thus the super lattice 11 existing in the region 14 is extinguished. Thereafter, the mask 17 is etched so as to have the stripe-shaped pattern 8 shown in FIG. 5. Then, proton having a kinetic energy of 120 KeV is implanted into the laser crystal, to form a region 18. AuGe ohmic electrode 19 is fabricated by the conventional evaporation method. Thus, the cross sections of the laser crystal taken along the lines A8—A8 and B9—B9 of FIG. 5 have structures shown in FIGS. 8 and 9. As mentioned in the EMBODIMENT I, the laser portion having the cross section of FIG. 8 is of an index guiding type, and the laser portion having the cross section of FIG. 9 is of a gain guiding type. Thus, a laser device having the structures shown in FIGS. 8 and 9 generates laser oscillation having a multi longitudinal mode, and the laser beam emitted from the device is small in astigmatism.

EMBODIMENT III

Figure 2:
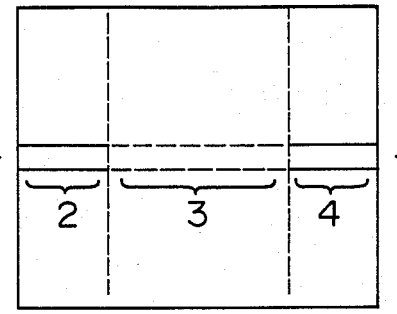
FIG. 2 is a plan view showing the basic construction of a laser device according to the present invention.
Figure 10:
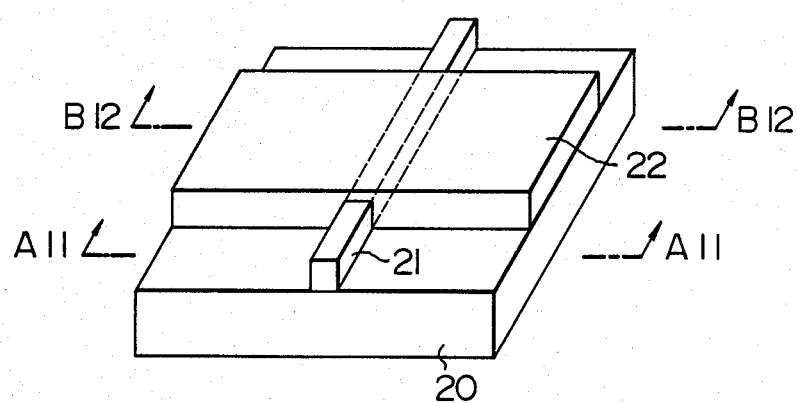
FIG. 10 is a perspective view showing a laser crystal mounted with a mask for ion implantation.
Figure 11:
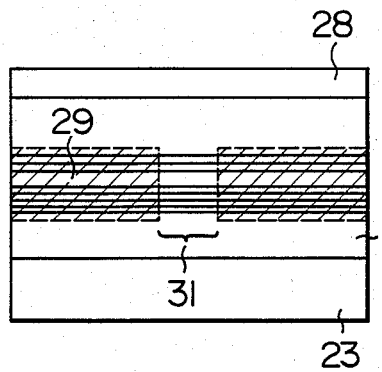
FIGS. 11 and 12 are sectional views showing a further embodiment of a laser device according to the present invention, which embodiment is formed by using the mask of FIG. 10.
Figure 12:
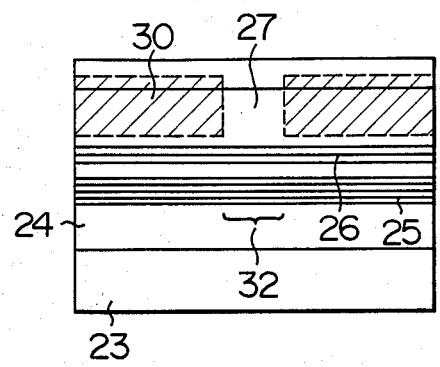

A mask for ion implantation is made so that a desired structure can be formed in a laser crystal by carrying out ion implantation only once and performing an annealing process only once. Referring to FIG. 10, tungsten is deposited on a laser crystal 20 to a thickness of 1.8 μm, and the tungsten layer is processed so as to have the form of a stripe 21 having a width of 2 μm. Thereafter, a polyimide resin is applied to the surface provided with the tungsten stripe 21, to a thickness of 3 μm, and then gold is deposited on the polyimide resin film to a thickness of 0.3 μm. The polyimide resin film and the gold film on a surface area corresponding to the portions 2 and 4 of FIG. 2 are removed, to form a mask 22. Then, silicon ions having a kinetic energy of 2.5 MeV are implanted into the laser crystal 20 from the surface provided with the masks 21 and 22. After the masks 21 and 22 have been entirely removed, the laser crystal is annealed at 800° C. for two hours. The cross sections of the laser crystal taken along the lines A11—A11 and B12—B12 of FIG. 10, have structures shown in FIGS. 11 and 12, respectively. In FIGS. 11 and 12, reference numeral 23 designates an n-GaAs substrate, 24 an n-Ga$_{0.65}$Al$_{0.35}$As layer serving as a cladding layer, 25 an n-type super lattice layer serving as an optical guide layer, 26 an undoped super lattice layer serving as a laser active layer, 27 a p-Ga$_{0.65}$Al$_{0.35}$As layer serving as another cladding layer, and 28 a p-GaAs layer serving as a cap layer. In a portion which is not provided with the gold mask 22, silicon ions reach the laser active layer 26 and the optical guide layer 25. When the laser crystal is annealed in the above-mentioned manner, super lattice layers 25 and 26 existing in a silicon implanted region 29 (which is formed on both sides of a region 31 lying just under the tungsten mask 21) are extinguished, and thus the above portion is an index guiding type laser having a buried heterostructure. In a portion provided with the gold mask 22, silicon ions do not reach the laser active layer 26, but a silicon implanted region 30 is formed in the cap layer 28 and the cladding layer 27. Thus, positive holes flow only in a region which exists just under the tungsten mask 21 and is surrounded by the silicon implanted region 30. That is, the region 30 acts as a current limiting region. Thus, a layer active region 32 existing under the tungsten mask 21 is of a gain guiding type. As mentioned above, a laser device having the basic structure of FIG. 2 can be formed by carrying out ion implantation only once. Incidentally, when silicon ions are implanted into the laser crystal 20 at an implant voltage of 0.5 to 6 MV, each of the super lattice layers 25 and 26 can be extinguished, that is, is converted into a mixed crystal by impurity induced disordering.

EMBODIMENT IV

Figure 13A:
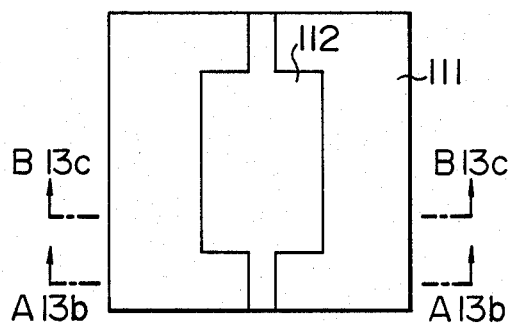
FIG. 13a is a schematic view showing a mixed crystal region of a super lattice which is included in a different embodiment of a laser device according to the present invention.
Figure 13B:
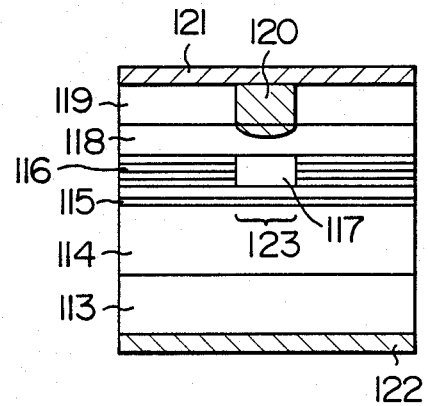
Figure 13C:
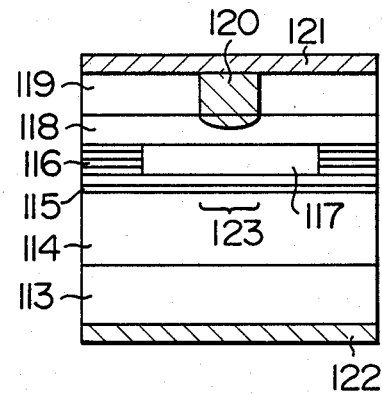

FIG 13a is a plan view showing that portion of a laser crystal which is implanted with electrically inactive dopant ions. In FIG. 13a, a direction from the top to the bottom indicates the lengthwise direction of laser cavity, and reference numerals 111 and 112 designate a portion where a photoresist film is left unremoved, and an ion implanted portion, respectively. FIGS. 13b and 13c are sectional views taken along the lines A13b—A13b and B13c—B13c of FIG. 13a.

Figure 14A:
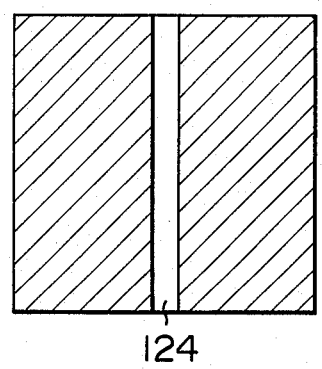
FIGS. 14a and 14b are schematic diagrams showing mask patterns which are used for forming the embodiment of FIGS. 13b and 13c.
Figure 14B:
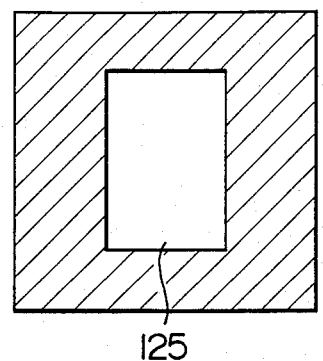

Referring to FIGS. 13b and 13c, an n-Ga$_{0.5}$Al$_{0.5}$As layer 114 (serving as a cladding layer), a multi quantum well layer 115 (formed of GaAs/GaAlAs layers and serving as a laser active layer), a super lattice layer 116 (serving as a light absorption layer), a p-Ga$_{0.5}$Al$_{0.5}$As layer 118 (serving as another cladding layer), and an n-GaAs layer 119 (serving as a cap layer) are grown by the MOCVD method, to form a laser crystal on an n-GaAs substrate 113. Further, a p-Ga$_{0.3}$Al$_{0.7}$As layer having a thickness of 0.3 μm and serving as a further cladding layer is formed between the laser active layer 115 and the light absorption layer 116. A mask M1 for ion implantation has a pattern shown in FIG. 14, for a single laser device. The width of a stripe 124 shown in FIG. 14a is equal to the width of the ion implanted portion 112 at the cross section taken along the line A13b—A13b of FIG. 13a. The mask M1 is placed on the laser crystal. Thereafter, fluorine ions are accelerated by a voltage of 1.5 MV, and then implanted into a region corresponding to the stripe 124, at a dose rate of $1 \times 10^{13}$ cm$^{-2}$. Further, magnesium ions are accelerated by the same voltage as mentioned above, and then implanted into the region corresponding to the stripe 124 at a dose rate of $2 \times 10^{13}$ cm$^{-2}$. Next, the mask M1 is removed, and another mask M2 having a pattern which is shown in FIG. 14b, is placed on the laser crystal. Then, fluorine ions are implanted into a region which corresponds to an area 125 shown in FIG. 14b, under the same conditions as mentioned above. The stripe 124 of the mask M1 has a width of 3 μm, and the area 125 of the mask M2 has a width of 50 μm and a length of 200 μm. It is not required to accurately locate the mask M2 in relation to the position of the mask M1 on the laser crystal. The mask M2 is removed after the ion implantation process, and then the laser crystal is annealed in the atmosphere of arsenic. The fluorine ions have been implanted into the super lattice layer 116 at a concentration of $1 \times 10^{18}$ cm$^{-3}$, and thus the super lattice layer 116 existing in the portion 112 of FIG. 13a is converted into a mixed crystal region 117. Meanwhile, magnesium ions are implanted into a region corresponding to the stripe 124 of FIG. 14a, and reach the p-type cladding layer 118 through the n-type cap layer 119. In FIGS. 13b and 13c, reference numeral 120 designates a p$^+$-type magnesium-implanted region. In FIG. 13b which shows the cross section taken along the line A13b—A13b of FIG. 13a, the p$^+$-type region 120 and the mixed crystal region 117 have the same width. In this cross section, laser light is absorbed by the super lattice layer 116 which is not converted into the mixed crystal region 117, and thus the transverse mode of laser oscillation is a fundamental mode. Meanwhile, in FIG. 13c which shows the cross section taken along the line B13c—B13c of FIG. 13a, the mixed crystal region 117 has a width of 50 μm, and the p$^+$-type region 120 has a width of 3 μm. Accordingly, a laser portion having the cross section of FIG. 13c performs the same operation as in a narrow stripe type laser, that is, generates laser oscillation having a higher-order transverse mode and a multi longitudinal mode. A laser device which includes a laser portion having the cross section of FIG. 13b and a laser portion having the cross section of FIG. 13c, emits a laser beam having a multi longitudinal mode and a single transverse mode. The laser device has an oscillation frequency of 790 nm, and the laser beam emitted from the device forms a far field pattern having a single peak, in an output range less than 8 mW. Thus, the laser beam can be focused on a spot having a diameter of 1 μm by a lens.

EMBODIMENT V.

Figure 15:
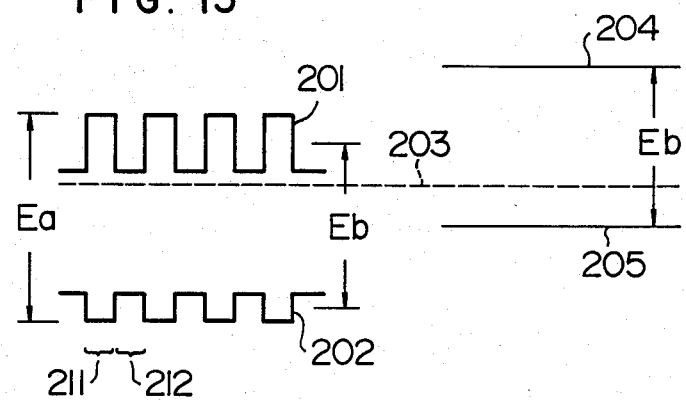
FIG. 15 is an energy-band diagram for explaining current confinement of type I.

FIG. 15 is an energy-band diagram of a super lattice which includes n-GaAs layers 211 each having a thickness of 60 Å and n-AlAs layers 212 each having a thickness of 60 Å. In FIG. 15, reference numeral 201 designates a conduction band, 202 a valence band, and 203 a Fermi level. The GaAs layer 211 serving as a barrier layer has an band gap $E_a$ Since the thickness of the barrier layer 212 is 60 Å, the overlapping of wave functions produced in adjacent quantum wells can be neglected. That is, quantum wells are arranged separately from each other, and the number of wells is equal to the number of GaAs layers each sandwiched between adjacent AlAs layers. Accordingly, even when a voltage is applied across the super lattice, there is little probability that a positive hole passes through the barrier layer by the tunnel effect. Thus, the super lattice acts as a blocking layer for positive holes. In order to present the conversion of the super lattice into a mixed crystal due to intermixing in a case where silicon is used as an n-type dopant of the super lattice, it is necessary to make the silicon concentration less than $5 \times 10^{17}$ cm$^{-3}$ and to keep a laser crystal containing the super lattice at temperatures lower than 800° C. Further, in a case where the silicon concentration is as high as $1 \times 10^{18}$ cm$^{-3}$, it is necessary to keep the laser crystal at temperatures lower than 600° C. When zinc is diffused into a portion of the super lattice at a temperature of 530° C., the portion is converted into a mixed crystal having a conduction band 204 and a valence band 205. The mixed crystal has a band gap $E_b$, as shown in FIG. 15. The band gap $E_b$ of the mixed crystal is smaller than the band gap $E_a$ of the super lattice, and the mixed crystal is doped with the p-type impurity. Accordingly, the mixed crystal does not have the blocking function for positive holes. The above-mentioned effect of zinc on the super lattice is called the current confinement of type I. Even if a p-type super lattice is used in place of the n-type super lattice, the same effect as above will be obtained. In this case, however, magnesium is used as a dopant for forming the p-type lattice, and a portion of the super lattice is converted into a mixed crystal by implanting silicon into the portion and by annealing a laser crystal including the super lattice at 800° C.

EMBODIMENT VI

Figure 16:
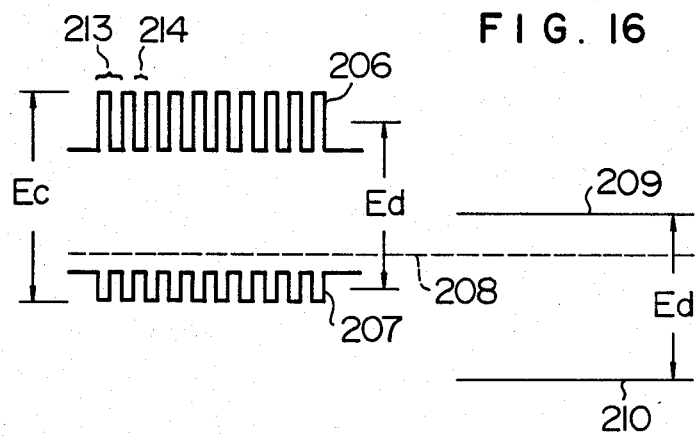
FIG. 16 is an energy-band diagram for explaining current confinement of type II.

Another method of current confinement will be explained, by reference to FIG. 16. Now, let us consider a case where a super lattice includes AlAs layers 213 each having a thickness of 20 Å and GaAs layers 214 each having a thickness of 20 Å, and is doped with silicon so that the silicon concentration is equal to $1 \times 10^{18}$ cm$^{-3}$. Beryllium ions are implanted into only a current flowing region of the super lattice so that the beryllium Concentration becomes equal to $5 \times 10^{18}$ cm$^{-3}$, and a laser crystal including the super lattice is annealed at 770° C. for 100 minutes. At this time, owing to the compensation effect of beryllium and silicon ions, the beryllium implanted region is not converted into a mixed crystal. Accordingly, the beryllium implanted region has a conduction band 206 and a valence band 207. Meanwhile, that region of the super lattice which is not implanted with beryllium ions, is converted by silicon ions into a mixed crystal which has a conduction band 209 and a valence band 210. Positive holes can pass through the thin barrier layer 213, and hence flow through the super lattice. Meanwhile, the mixed crystal is made of n-GaAlAs, and hence positive holes are blocked by the mixed crystal. Such current confinement is called the current confinement of type II. Incidentally, in FIG. 16, reference symbols $E_C$ and $E_D$ designate the band gap of the super lattice and the band gap of the mixed crystal, respectively, and reference numeral 208 designates a Fermi level.

EMBODIMENT VII

Figure 17:
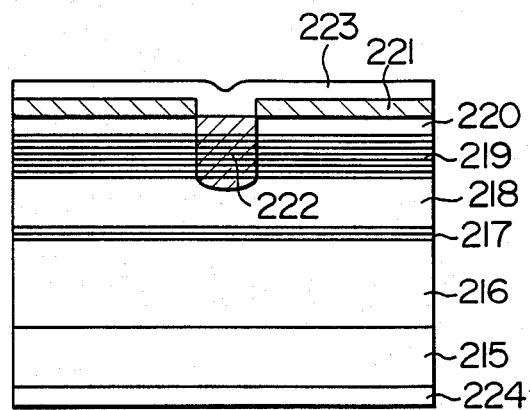
FIG. 17 is a sectional view showing still another embodiment of a laser device according to the present invention.
Figure 18:
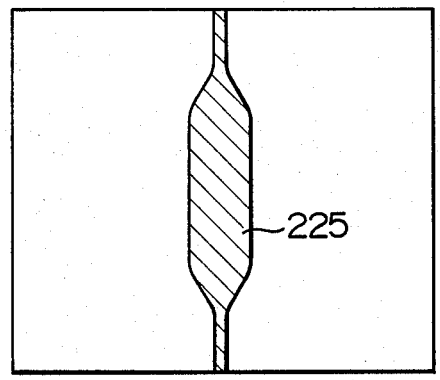
FIG. 18 is a schematic diagram showing the current flowing area of the embodiment of FIG. 17.

FIG. 17 shows a laser device using the current confinement of type I. Referring to FIG. 17, an n-$Ga_{0.5}Al_{0.5}As$ layer 216 (serving as a cladding layer), a multi quantum well layer 217 (serving as a laser active layer), a p-$Ga_{0.5}Al_{0.5}As$ layer 218 (serving as another cladding layer), an n-type multi quantum well layer 219 (serving as a blocking layer), and an n-GaAs layer 220 (serving as a cap layer) are grown by the MOCVD method, to form a laser crystal on an n-GaAs substrate 215. A diffusion preventing mask 221 is mounted on the laser crystal, and zinc is diffused from an exposed surface area into the laser crystal so as to reach the cladding layer 218 through the layers 219 and 220. The n-type multi quantum well layer 219 has the same structure as the super lattice described in the EMBODIMENT V, and is previously doped with silicon to the same extent as mentioned in the EMBODIMENT V. When an annealing process has been performed, the n-type multi quantum well layer 219 existing in a zinc diffused region 222 is converted into a mixed crystal by the intermixing of super lattice, and thus can be used as a current path. In order for the laser beam emitted from the device to form a far field pattern having a single peak, the zinc diffused region 222 has a width of 2 $\mu$m at both ends of the laser crystal and a width of 10 $\mu$m at a central portion thereof. The width of the zinc diffused region 222 is gradually increased from 2 $\mu$m to 10 $\mu$m, as indicated by a hatched area 225 in FIG. 18. After a positive electrode 223 has been formed, the substrate 215 is ground to reduce the thickness thereof, and then a negative electrode 224 is formed on the substrate. The laser crystal thus obtained is divided into laser pellets by cleavage or others. According to the inventors' experiments, when the distance d between the bottom of the zinc diffused region 222 and the laser active layer 217 lay in a range from 0.5 to 0.8 $\mu$m, the laser beam emitted from a laser pellet was able to form a favorable far field pattern. Further, when the above distance d made equal to 0.6 $\mu$m, the threshold current of laser oscillation was 60 mA.

EMBODIMENT VIII

A laser crystal is formed in a manner similar to that described in the EMBODIMENT VII. However, in order to use the current confinement of type II, the n-type multi quantum well layer 219 serving as the blocking layer has the same structure as the super lattice described in the EMBODIMENT VI, and is previously doped with silicon so that the silicon concentration is $1 \times 10^{18}$ cm$^{-3}$. The mask 221 (not for diffusion process but for ion implantation) is mounted on the laser crystal, and beryllium ions are implanted into the region 222 so that the beryllium concentration becomes equal to $5 \times 10^{18}$ cm$^{-3}$. Then, the mask 221 is removed, and the laser crystal is annealed at 770° C. for two hours, to convert that portion of the n-type multi quantum well layer which is not implanted with beryllium, in a mixed crystal. Then, the laser crystal is processed in the same manner as described in the EMBODIMENT VII, to obtain a laser device. According to the inventors' experiments, when the above-mentioned distance d was made equal to 0.6 $\mu$m, the threshold current of laser oscillation was 50 mA, and the laser beam emitted from the device formed a favorable far field pattern in an output range less than 10 mW. Further, when this laser device was incorporated in a compact disc apparatus, a signal-to-noise ratio of 90 dB was obtained, and the optical feedback noise was low.

EMBODIMENT IX

A laser crystal which is different in conductivity type from the laser crystal described in the EMBODIMENT VII but uses the current confinement of type I, is formed in the following manner.

A p-GaAlAs layer (having a thickness of 1.5 $\mu$m and serving as a cladding layer), an InGaAs layer (having a thickness of 0.1 $\mu$m and serving as a laser active layer), an n-GaAlAs layer (having a thickness of 0.7 $\mu$m and serving as another cladding layer), a p-type super lattice layer (serving as a current blocking layer), and a p-GaAs layer (having a thickness of 0.1 $\mu$m and serving as a cap layer) are grown by the molecular beam epitaxial method, to form a laser crystal on a p-GaAs substrate. The p-type super lattice layer includes 50 pairs of an InGaAs layer and GaAlAs layer each having a thickness of 50 Å. Then, silicon ions are implanted from the surface area 225 of FIG. 18 into the laser crystal so that the silicon concentration of the super lattice layer lying under the area 225 is greater than $2 \times 10^{18}$ cm$^{-3}$. The super lattice layer is previously doped with magnesium so that the magnesium concentration is about $5 \times 10^{17}$ cm$^{-3}$, to act as a blocking layer for electron. The laser crystal thus treated is annealed at 680° C. for three hours in the atmosphere of arsenic, to convert the super lattice layer lying under the surface area 225 into a mixed crystal. Then, the laser crystal is subjected to the ordinary processing for fabricating a laser device.

According to the inventors' experiments, the threshold current of laser oscillation of the above device was 70 mA, and multi-mode oscillation having a center frequency with a wavelength of 724 nm was generated in the laser device. Further, a far field pattern having a single peak was formed by the laser beam emitted from the device.

EMBODIMENT X

A laser device in which the index guiding type action is combined with the gain guiding type action, can be formed in the following manner. The n-GaAlAs layer 216 (serving as a cladding layer), the quantum well layer 217 (formed of GaAs/GaAlAs layers and serving as a laser active layer), the p-GaAlAs layer 218 (serving as another cladding layer), the n-type super lattice layer 219 (serving as the current blocking layer), and the n-GaAs layer (serving as the cap layer) are grown by the MOCVD method, to form a laser crystal on the n-GaAs substrate 215. The super lattice layer 219 includes a plurality of GaAs layers each having a thickness of 50 Å and a plurality of GaAlAs layers each having a thickness of 60 Å, and is doped with silicon so that the silicon concentration is $1 \times 10^{18}$ cm$^{-3}$. Next, beryllium ions are implanted from the surface area 225 into the laser crystal so that beryllium concentration of the region 222 is $2\times 10^{18}$ cm$^{-3}$. Then, the laser crystal is annealed at 750° C. for two hours. That portion of the super lattice layer 219 which is implanted with beryllium, is left unchanged, and the remaining portion of the layer 219 is converted into a mixed crystal. The laser crystal is subjected to the ordinary processing for fabricating a laser device.

The inventors fabricated such laser devices, in which the distance d between the current blocking laser 219 and the laser active layer 217 took various values in a range from 0.2 to 0.8 μm, and studied the longitudinal mode of each laser device. In laser devices having the distance d greater than 0.2 μm and less than 0.7 μm, the index guiding type action was remarkable, and the laser beam emitted from each device was able to form a stable far field pattern having a single peak, in an output range less than 10 mW. Furthermore, the threshold current of laser oscillation was 15 mA smaller than that of the laser device described in the EMBODIMENT VII.

EMBODIMENT XI

A semiconductor laser fabricating method will be explained in which ion implantation is carried out by using a self alignment process.

Figure 19A:
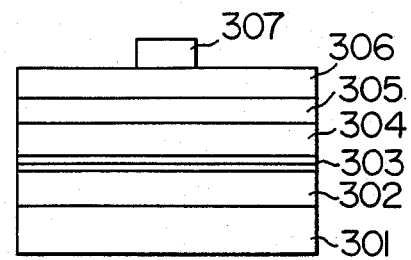
FIGS. 19a to 19g are sectional views for explaining a semiconductor laser fabricating method which includes a self alignment process in accordance with the present invention.

Referring to FIGS. 19a, an n-Ga$_{0.5}$Al$_{0.5}$AS layer 302 (serving as a cladding layer), an undoped multi quantum well layer 303 (made of GaAs/Ga$_{0.5}$Al$_{0.5}$As layers and serving as a laser active layer), a p-Ga$_{0.5}$Al$_{0.5}$As layer 304 (serving as another cladding layer), and an n-GaAs layer 305 (serving as a cap layer) are grown by the MOCVD method to form a laser crystal on an n-GaAs substrate 301. Then, tungsten 306 is deposited on the laser crystal to a thickness of 1.5 μm, and a photoresist film 307 having a stripe-shaped pattern is formed on the tungsten layer 306.

Figure 19E:
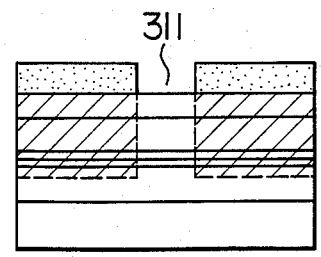
Figure 19B:
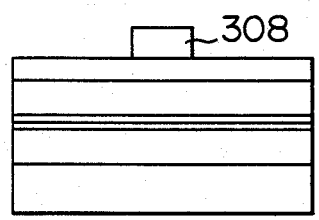
Figure 19F:
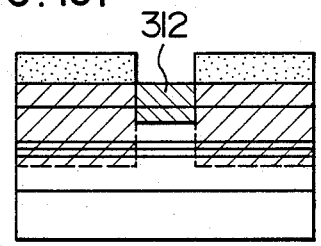
Figure 19C:
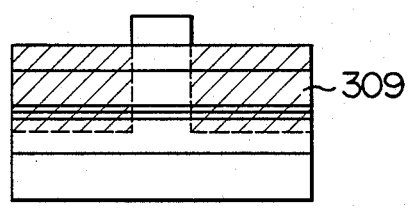

Next, the tungsten layer 306 is etched through the dry etching method using SF$_6$. At this time, the photoresist film 307 is used as a mask. Thus, a tungsten stripe 308 having a width of 2 μm is formed, as shown in FIG. 19b. Then, fluorine ions are accelerated by a voltage of 1 MV, and are implanted into a region 309 by using the tungsten stripe 308 as a mask, as shown in FIG. 19c, so that the multi quantum well layer 303 in the region 309 has a fluorine concentration of $2\times 10^{18}$ cm$^{-3}$ or more.

Figure 19G:
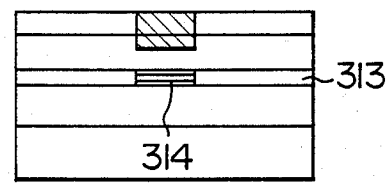
Figure 19D:
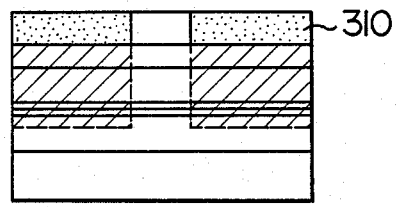

Next, a resist material 310 such as the PIQ (trademark) is applied to the surface of the fluorine implanted region 309 to a thickness of 1.4 μm, as shown in FIG. 19d. Then, the tungsten stripe 308 is removed by the dry etching method using SF$_6$, and thus a 2-μm-wide surface area 311 of the laser crystal is exposed, as shown in FIG. 19e. Further, beryllium ions are accelerated by a voltage of 100 KV, and are implanted from the surface area 311 into the laser crystal, to form a p$^+$-type region 312 as shown in FIG. 19f. The ion accelerating voltage is not limited to 100 KV, but may be a value capable of passing the beryllium ions through the cap layer 305. Next, the resist material is removed as shown in FIG. 19g, and the laser crystal is annealed at 800° C. for one hour in the atmosphere of arsenic. A stripe-shaped portion 314 of the multi quantum well layer 303 which lies under the surface area 311, is left unchanged, but the remaining portion 313 of the layer 303 is converted into a mixed crystal. Thus, a buried heterostructure is formed. Further, a pn junction in the beryllium implanted region 312 is extinguished, and hence a laser exciting current concentrates into the buried heterostructure. Thus, the laser crystal is low in threshold current and can generate laser oscillation of single mode.

A laser device was fabricated by subjecting such a laser crystal to ordinary processing. In this laser device, the threshold current of laser oscillation was 10 mA. Further, the laser device showed an output characteristic that a current versus output-power curve with no kink was obtained in an output range less than 100 mW.

EMBODIMENT XII

A high-output laser device with windows can be formed by modifying the laser device described in the EMBODIMENT XI, in such a manner that fluorine ions are implanted into only end portions of the laser active layer having a cavity length of 25 μm which have a length of 5 μm in the lengthwise direction of laser cavity. According to the inventors' experiments, even when the output of the laser device was increased to 200 mW, the catastrophoic damage to laser facets did not occur.

EMBODIMENT XIII

A multi longitudinal mode laser device having a transverse mode filter will be shown in which an index guiding region serving as the mode filter is formed in both end portions of the laser device, and the remaining portion thereof acts as a multi longitudinal mode laser based upon current confinement. The fabrication method and structure of the laser device will be explained below, by reference to FIGS. 20a-1 to 20a-12 and 20b-1 to 20b-7.

The n-Ga$_{0.5}$Al$_{0.5}$As layer 302 (serving as a cladding layer), the undoped multi quantum well layer 303 (formed of GaAs/Ga$_{0.6}$Al$_{0.4}$As layers and serving as a laser active layer), a p-Ga$_{0.8}$Al$_{0.2}$As layer 315 (serving as an optical guide layer), the p-Ga$_{0.5}$Al$_{0.5}$As layer 304 (serving as another cladding layer), and the n-GaAs layer 305 (serving as a cap layer) are grown by the molecular beam epitaxial method, to form a laser crystal on the n-GaAs substrate 301.

Figure 1:
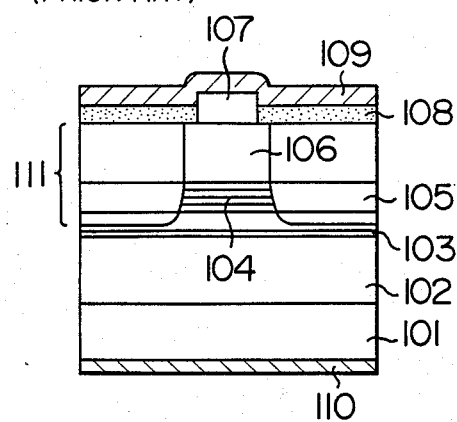
FIG. 1 is a sectional view showing a conventional semiconductor laser device.
Figures 1, 20A:
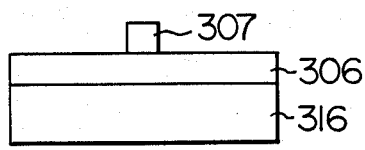
Figures 1, 20B:
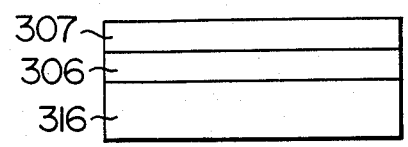
Figures 2, 20A:
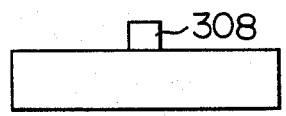
Figures 2, 20B:
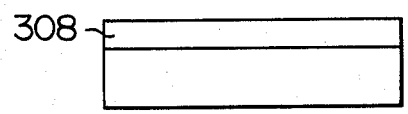
Figures 3, 20A:
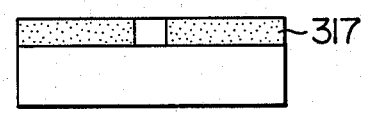
Figures 3, 20B:
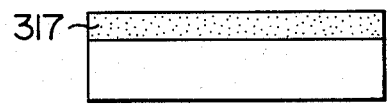
Figures 4, 20A:
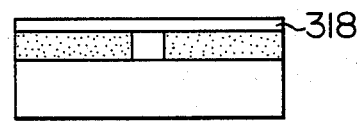
Figures 4, 20B:
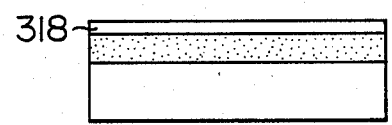
Figures 5, 20A:
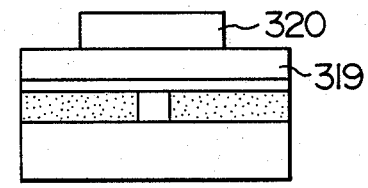
Figures 5, 20B:
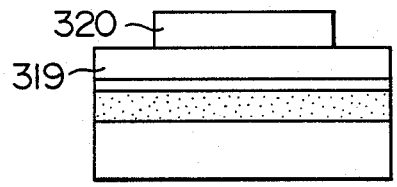
Figures 6, 20A:
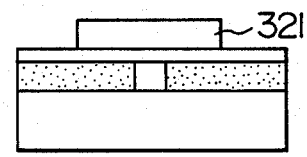
Figures 6, 20B:
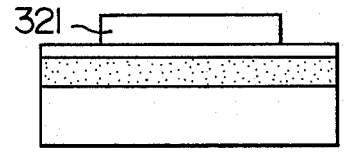
Figures 11, 20A:
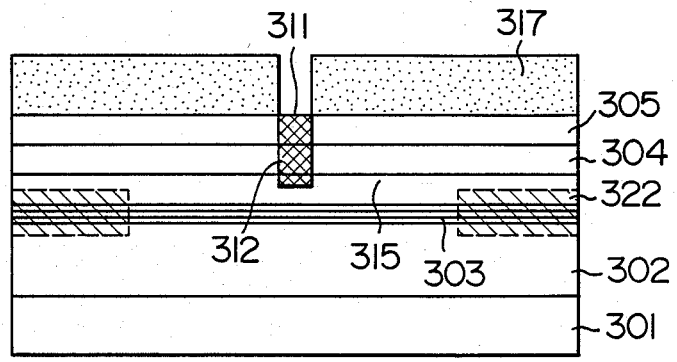
Figures 12, 20A:
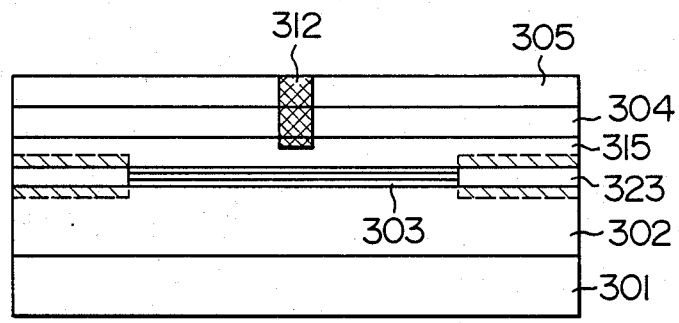

FIGS. 20a-1 to 20a-12 are sectional views perpendicular to the direction of laser cavity, and show a multi-longitudinal-mode laser portion based upon current confinement. FIGS. 20b-1 to 20b-7 are side views of the laser device, and correspond to FIGS. 20a-1 to 20a-7, respectively. In these figures, reference numeral 316 designates a crystal including the substrate 301 and the layers 302 to 305 and 315.

Figure 3:
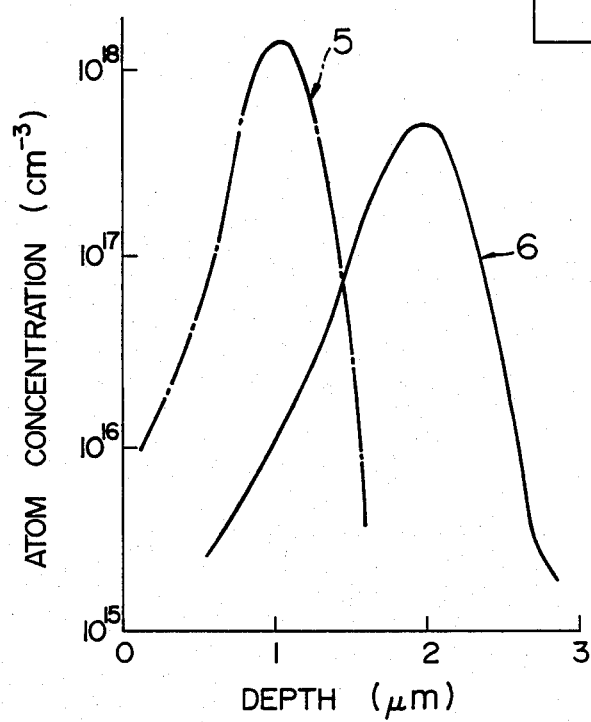
FIG. 3 is a graph showing relations between the depth from the surface of a laser crystal and the impurity concentration due to ion implantation.

Referring to FIGS. 20a-1 and 20b-1, tungsten 306 is deposited on the crystal 316 to a thickness of 1.5 μm, and a stripe-shaped photo-resist layer 307 having a width of 2 μm is formed on the tungsten layer 316. Next, the tungsten 316 is etched by the etching method described in the EMBODIMENT XI, to form a tungsten stripe 308 as shown in FIGS. 20a-2 and 20b-2. Then, a resist material 317 such as the PIQ is applied to the surface of the crystal 316 as shown in FIGS. 20a-3 and 20b-3, to obtain the same surface state as shown in FIG. 19d. Thereafter, an SiO$_2$ layer 318 having a thickness of 0.2 μm is formed on the tungsten stripe 308 and the resist layer 317, as shown in FIG. 20a-4 and 20b-4. Further, a tungsten film 319 having a thickness of 1.5 μm is formed on the SiO$_2$ layer 318 and a photoresist layer 320 is formed on the tungsten film 319, as shown in FIGS. 20a-5 and 20b-5. The photoresist layer 320 has a width of 20 μm in directions perpendicular to the lengthwise direction of laser cavity, and has a length of 150 μm in the lengthwise direction of laser cavity. Further, those end portions of the crystal 316 which have a length of 50 μm in the lengthwise direction of laser cavity, are not provided with the photoresist layer 320, as shown in FIG. 20b-5. The tungsten film 319 is etched through the dry etching method using $SF_6$. At this time, the photo-resist layer 320 is used as a mask, to form a tungsten mask 321 as shown in FIGS. 20a-6 and 20b-6. Then, silicon ions are implanted into the crystal 316 at an implant voltage of 3 MV by using the tungsten mask 321, to form a silicon implanted region 322 having a silicon concentration of $1 \times 10^{18}$ cm$^{-3}$, as shown in FIG. 20a-7. The tungsten mask 321 is removed by $SF_6$, as shown in FIG. 20a-8, and then the $SiO_2$ layer 318 is removed by $CHF_3$, as shown in FIG. 20a-9. Further, the tungsten stripe 308 is etched off by $SF_6$, as shown in FIG. 20a-10. Next, beryllium ions are implanted from a striped-shaped, exposed surface area 311 into the crystal 316 so that a beryllium implanted region 312 pierces the layers 305 and 304 (FIG. 20a-11). The resist material 317 is removed, and then the crystal is annealed at 800° C. for one hour in the atmosphere of arsenic. Thus, the beryllium implanted region 312 becomes a p-type region, and the multi quantum well layer 303 existing in the silicon implanted region 322 is converted into a mixed crystal layer 323, as shown in FIG. 20a-12. Incidentally, FIG. 20a-12 shows the cross section of center part of a laser element of this EMBODIMENT which center part corresponds to the arrow B of FIG. 20b-7. Meanwhile, the cross section of edge part, which corresponds to the arrow B of FIG. 20b-7, of the same element will have a structure similar to that shown in FIG. 19g, since the resist material 317 does not have the stopping power for silicon ions having a kinetic energy of 3 MeV. That is, a laser portion having the same cross section as indicated by the arrow A in FIG. 20b-7, will act as an index guiding type laser having a single transverse mode.

A laser device was fabricated by subjecting such a laser crystal to the ordinary processing. The threshold current of laser oscillation of the device was 40 mA, and laser oscillation having a fundamental transverse mode and a multi longitudinal mode was generated in the device.

EMBODIMENT XVI

The mask 308 for ion implantation used in the EMBODIMENT XI is not made of tungsten, but is formed of a double-layer metal film. That is, molybdenum is deposited on the laser crystal which includes the lasers 301 to 305 of FIG. 19a, to a thickness of about 500 Å, and gold is deposited on the molybdenum layer to a thickness of about 1 μA, to form a double layer film. Then, a stripe-shaped photoresist film having a width of 2 μm is formed on the Mo/Au film. Then, the Au layer is etched by the ion milling method. At this time, the photoresist film is used as a mask. Further, an exposed portion of the Mo layer is dry etched by a gas mixture of $CF_4$ and $O_2$, to form a double layer mask (namely, Mo/Au mask) for selective ion implantation. In the above explanation, the mask for selective ion implantation has been formed of the Mo layer and the Au layer. However, the mask may be made of a heavy metal other than tungsten, or may be formed of a multi-layer film other than the Mo/Au film.

In the foregoing, various embodiments of the present invention have been explained. It is to be noted that laser devices having such a current confinement structure that the width $d_{ce}(x)$ of a current path at a central portion of a laser device is smaller than the width of the effective optical waveguide or laser active area at the central portion, can generate laser oscillation having a multi longitudinal mode. Further, ions having a kinetic energy of 500 KeV or less fail to convert a super lattice which is deep in a laser crystal and is large in thickness, into a mixed crystal, and ions having a kinetic energy of 6 MeV or more pierce the laser crystal. In either case, it is impossible to form a laser device according to the present invention.

We claim:

1. A semiconductor laser device including a substrate and semiconductor layers formed on the substrate, the semiconductor layers forming a resonant cavity and including a laser active layer serving to emit light and an optical guide layer, and a pair of electrodes supplying carriers to said active layer, at least one of the laser active layer and the optical guide layer being formed of super lattices, wherein part of at least one of the super lattices is converted into a mixed crystal by impurity induced disordering based upon one of impurity diffusion and impurity ion implantation, to divide the super lattice into a first region formed of the mixed crystal and a second region having a super lattice structure, the width of the second region in directions perpendicular to the lengthwise direction of a laser cavity varying along said lengthwise direction, the mean value of the width of a laser excitation region in direction perpendicular to said lengthwise direction being smaller than the mean value of said width of said second region, a laser oscillation mechanism being affected by a gain guiding type portion and an index guiding type portion which are included in the laser device, and wherein that portion of the laser device which exists extending from main laser-beam-emitting surfaces of the device are of an index guiding type.

2. A semiconductor laser device according to claim 1, wherein said width of said second region at at least one of end surfaces of the laser device adjacent thereto and corresponds to the fundamental transverse more of laser oscillation, and said width of said second region increases smoothly or stepwise in the remaining portion of the laser device.

3. A semiconductor laser device according to claim 1, wherein the width of a current path at the laser active layer is smaller than said width of said second region at that central portion of the laser device which is larger in said width of said second region than an end surface of the laser device, to generate gain guiding type laser oscillation having a multi longitudinal mode.

4. A semiconductor laser device according to claim 3, wherein second impurity ions of the same kind as first impurity ions for causing said impurity induced disordering in the super lattice are implanted into the laser device at an implant voltage different from the implant voltage of the first impurity ions or through a mask so as not to reach the laser active layer and/or the optical guide layer, to control the width of the current path at the laser active layer.

5. A semiconductor laser device according to claim 4, wherein impurity ions are implanted into the laser device at an implant voltage of 500 KV to 6 MV and then the laser device is annealed, to convert part of at least one of the super lattices into the mixed crystal by impurity induced disordering.

6. A semiconductor laser device comprising:
a substrate;

semiconductor layers, forming a resonant cavity, formed on said substrate, said semiconductor layers including a laser active layer; and a pair of electrodes supplying carriers to said active layer;

said semiconductor layers including a super lattice layer in the vicinity of said laser active layer, a region of said super lattice layer being converted into a mixed crystal by implanting electrically inactive dopant ions into said super lattice layer from a surface area having the form of a stripe parallel to the lengthwise direction of the resonant cavity and by annealing the ion implanted region leaving another region of the super lattice layer not converted, and wherein the width of said another region at both ends of the laser device and adjacent thereto is narrower than that of said another region in the remaining portion of the laser device; and means for confining a current to the mixed crystal region of said super lattice layer and that region of said laser active layer which exists adjacent said mixed crystal region.

7. A semiconductor laser device according to claim 6, wherein the width of said mixed crystal region changes along the lengthwise direction of said laser cavity.

8. A semiconductor laser device according to claim 6, wherein said current confinement means is an impurity doped region which is formed by doping a stripe-shaped region of the laser device parallel to said mixed crystal region, with an electrically active impurity by an ion implantation method.

9. A semiconductor laser device according to claim 8, wherein the width of said mixed crystal region is at least equal to the width of said impurity doped region extending from both ends of the laser device, and the width of said mixed crystal region is greater than the width of said impurity doped region at a central portion of the laser device.

10. A semiconductor laser device comprising:
a substrate;
semiconductor layers, forming a resonant cavity, formed on the substrate, the semiconductor layers including a laser active layer;
a pair of electrodes, one of said electrodes being kept in contact with a semiconductor substrate; and
a cladding layer and a super lattice layer formed between the other electrode and said laser active layer, said cladding layer being contiguous to said laser active layer, said cladding layer and said super lattice layer being different from each other in conductivity type, said cladding layer being electrically connected with the other electrode by an impurity doped region which pierces said super lattice layer and is equal in conductivity type to said cladding layer, and one of that region of said super lattice layer which is included in said impurity doped region, and the remaining region of said super lattice layer being converted into a mixed crystal by the impurity induced intermixing of super lattice.

11. A semiconductor laser according to claim 10, wherein said super lattice layer is previously doped with a first impurity to such an extent that a predetermined heat treatment fails in the conversion of said super lattice layer into said mixed crystal based upon the impurity induced intermixing of super lattice, and said impurity doped region is doped with a second impurity to such an extent that the predetermined heat treatment can convert that region of said super lattice layer which is included in said impurity doped region, into said mixed crystal.

12. A semiconductor laser device according to claim 10, wherein said super lattice layer is previously doped with a first impurity to such an extent that a predetermined heat treatment can convert said super lattice layer into said mixed crystal by the impurity induced intermixing of super lattice, said impurity doped region is doped with a second impurity so that the second-impurity concentration of said impurity doped region is at least substantially equal to the first-impurity concentration of said super lattice layer and the predetermined heat treatment fails in the conversion of that region of said super lattice which is included in said impurity doped region, into said mixed crystal, on the basis of the compensation effect of said first and second impurities.

13. A semiconductor laser device according to claim 10, wherein that region of said super lattice layer which is included in said impurity doped region has the super lattice structure, the remaining region of said super lattice layer is converted in a mixed crystal, said super lattice region included in said impurity doped region is greater in refractive index for the wavelength of laser oscillation than the mixed crystal region of said super lattice layer, and the distance between said impurity doped region and said laser active layer is so set as to couple said laser active layer optically with said super lattice region included in said impurity doped region.

14. A semiconductor laser device according to claim 13, wherein the distance between said impurity doped region and said laser active lies in a range from 0.2 to 0.7 μm.

15. A semiconductor laser device comprising:
a substrate;
semiconductor layers formed on said substrate, said semiconductor layers forming a resonant cavity and including an active layer serving to emit light, wherein said semiconductor layers include at least one superlattice layer and form index guiding regions and a gain guiding region between said index guiding regions in the direction of said resonant cavity, and wherein said index guiding regions and gain guiding region are formed by converting a part of one of said at least one superlattice layers to a mixed crystal so as to make said one of said at least one super lattice layers have a relatively larger width at said gain guiding region and a relatively smaller width at said index guiding regions;
a cap layer formed on said semiconductor layers; and
a pair of electrodes supplying carriers to said active layer.

16. A semiconductor laser device according to claim 15, wherein a remaining part of the superlattice layer not converted to a mixed crystal constitutes said active layer, and said semiconductor further includes cladding layers on each side of the superlattice layers, with one of the cladding layers including an impurity doped region extending at least over the part of the superlattice layer that has been converted to a mixed crystal, said impurity-doped region acting as a blocking layer for positive holes to confine a current flowing through the semiconductor layers.

17. A semiconductor layer device according to claim 15, wherein a remaining part of the superlattice layer not converted to a mixed crystal constitutes said active layer, and said semiconductor layers include cladding layers on each side of the superlattice layer, with one of the cladding layers including an impurity-doped region acting as a blocking layer for positive holes to confine a current flowing through the semiconductor layers.

18. A semiconductor device according to claim 17, wherein said impurity-doped region extends over a portion of said remaining part of the superlattice layer at said gain guiding region and does not extend at said index guiding regions, and said part of the superlattice layer that has been converted to a mixed crystal extends at said index guiding regions and not at said gain guiding regions.

19. A semiconductor laser device according to claim 16, wherein said impurity-doped region extends only over the part of the superlattice layer that has been converted to a mixed crystal at the index guiding regions, and extends over said part of the superlattice layer that has been converted to a mixed crystal and a portion of said remaining part at the gain guiding region.

20. A semiconductor laser device according to claim 19, wherein the remaining superlattice layer at the index guiding regions has a width of at least 10 μm.

21. A semiconductor laser device comprising:
a substrate;
semiconductor layers formed on said substrate, said semiconductor layers constituting a resonant cavity and including an active layer serving to emit light, wherein said semiconductor layers include at least one superlattice layer and form index guiding regions and a gain guiding region between said index guiding regions in the direction of said resonant cavity, said regions being formed by converting a part of one of the at least one superlattice layers to a mixed crystal such that the mixed crystal part has a relatively larger width at the gain guiding region and a relatively smaller width at said index guiding regions;
a cap layer; and
a pair of electrodes supplying carriers to said active layer.

22. A semiconductor laser device according to claim 21, wherein the semiconductor layers include cladding layers on both sides of the at least one superlattice layer, with one of the cladding layers having an impurity-doped region therein over the part of the one of the at least one superlattice that has been converted to a mixed crystal part.

23. A semiconductor laser device according to claim 21, wherein said at least one superlattice layers include at least two superlattice layers, with one of the at least two superlattice layers constituting said active layer and another of the at least two superlattice layers constituting a blocking layer, and wherein the mixed crystal part is formed in the superlattice layer constituting the blocking layer such that the mixed crystal part can be used as a crystal path.

24. A semiconductor laser device according to claim 23, wherein the semiconductor layers further include cladding layers, the cladding layers including a cladding layer between the superlattice layers constituting the active layer and the blocking layer, and wherein the cladding layer between the superlattice layers constituting the active and blocking layers includes an impurity-doped region, said impurity-doped region being in beneath the mixed crystal part.

25. A semiconductor laser device according to claim 24, wherein the impurity-doped region is spaced from the active layer by 0.5 to 0.8 μm.

26. A semiconductor laser device according to claim 22, wherein said impurity-doped region has a width the same as the width of the mixed crystal part at the index guiding regions.

27. A semiconductor laser device according to claim 26. wherein said semiconductor layers includes two superlattice layers, one of the two superlattice layers constituting said active layer and the other superlattice layer constituting a light absorption layer, and wherein the superlattice layer constituting the light absorption layer has a part thereof converted to the mixed crystal part.

28. A semiconductor laser device according to claim 27, wherein the two superlattice layers are separated from each other by a further cladding layer.

* * * * *